(12) United States Patent
Suh et al.

(10) Patent No.: US 7,893,625 B2
(45) Date of Patent: Feb. 22, 2011

(54) FLAT PANEL DISPLAY DEVICE WITH COMPENSATED VOLTAGE DROP

(75) Inventors: Mi-Sook Suh, Seoul (KR); Byung-Hee Kim, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1091 days.

(21) Appl. No.: 10/926,728

(22) Filed: Aug. 25, 2004

(65) Prior Publication Data

US 2005/0057461 A1 Mar. 17, 2005

(30) Foreign Application Priority Data

Aug. 28, 2003 (KR) .................. 10-2003-0059994

(51) Int. Cl.
*G09G 3/10* (2006.01)
(52) U.S. Cl. .............. 315/160; 315/169.3; 345/77; 345/204
(58) Field of Classification Search ........... 315/161, 315/169.1–169.3, 160, 167; 345/56–84, 345/206, 76–83, 204, 690; 313/582, 588, 313/503, 510
See application file for complete search history.

(56) References Cited

U.S. PATENT DOCUMENTS

| | | | |
|---|---|---|---|
| 6,366,025 B1 | 4/2002 | Yamada | |
| 6,815,710 B2 * | 11/2004 | Tsuchida | 257/40 |
| 6,815,903 B2 * | 11/2004 | Nakanishi | 315/169.3 |
| 6,965,363 B2 * | 11/2005 | Sato et al. | 345/82 |
| 7,064,350 B2 * | 6/2006 | Park | 257/72 |
| 7,304,639 B2 * | 12/2007 | Park et al. | 345/206 |
| 2003/0122495 A1 * | 7/2003 | Nakanishi | 315/169.3 |
| 2003/0155612 A1 | 8/2003 | Kawachi et al. | |

(Continued)

FOREIGN PATENT DOCUMENTS

CN 1304182 A 7/2001

(Continued)

OTHER PUBLICATIONS

Patent Abstracts of Japan, Publication Number: 2003-168570; Date of Publication: Jun. 13, 2003; in the name of Genshiro Kawachi et al.

(Continued)

*Primary Examiner*—Jacob Y Choi
*Assistant Examiner*—Jimmy T Vu
(74) *Attorney, Agent, or Firm*—Christie, Parker & Hale, LLP (57) ABSTRACT

A flat panel display device in which a cathode line and a power line are arranged such that voltage drops therein compensate each other. The flat panel display device of the present invention includes an insulating substrate having a pixel region in which pixels are arranged; a power line for supplying a power supply voltage to the pixels; and a cathode electrode having a cathode contact for supplying a cathode voltage to the pixels, wherein an input side of the power line and the cathode contact of the cathode electrode are arranged on the substrate opposite each other with respect to the pixel region. The cathode electrode further includes a cathode bus line for applying an external cathode voltage, the cathode electrode being in contact with the cathode bus line via the cathode contact to provide the external cathode voltage to the pixels.

19 Claims, 5 Drawing Sheets

U.S. PATENT DOCUMENTS

| | | |
|---|---|---|
| 2004/0056591 A1 | 3/2004 | Koo et al. |
| 2004/0081751 A1* | 4/2004 | Nakanishi et al. ........... 427/108 |
| 2004/0115989 A1* | 6/2004 | Matsueda et al. ........... 439/577 |

FOREIGN PATENT DOCUMENTS

| | | |
|---|---|---|
| CN | 1329368 A | 1/2002 |
| CN | 1427386 A | 7/2003 |
| JP | 2003-168570 | 6/2003 |
| JP | 2003-216100 | 7/2003 |
| KR | 2001-0014501 | 2/2001 |
| KR | 2003-0057070 | 7/2003 |
| KR | 2003-0067547 | 8/2003 |
| KR | 10-2004-0025383 | 3/2004 |

OTHER PUBLICATIONS

Patent Abstracts of Japan, Publication Number: 2003-216100; Date of Publication: Jul. 30, 2003; in the name of Hiroshi Takahara.

Japanese Office Action dated May 29, 2007 for corresponding Japanese patent application No. 2004-155255.

English abstract for Korean publication 10-2003-0067547 dated August 14, 2003.

Korean Patent Abstract for publication 1020030057070 A dated Jul. 4, 2003.

Korea Office action dated Aug. 10, 2005 for corresponding Korean Patent application 10-2003-0059994.

Korean Patent Abstract, Publication No. 010014501 A, Published on Feb. 26, 2001, in the name of Furumiya, et al.

Chinese Office action dated Nov. 30, 2007, for corresponding China Patent application 200410090009.2, with English translation indicating relevance of reference in this IDS.

Chinese Certificate dated Feb. 18, 2009, for corresponding Chinese Patent application 200410090009.2, noting listed references in this IDS.

* cited by examiner

FLAT PANEL DISPLAY DEVICE WITH COMPENSATED VOLTAGE DROP

CROSS-REFERENCE TO RELATED APPLICATION

This application claims priority to and the benefit of Korean Patent Application No. 2003-59994, filed Aug. 28, 2003, the disclosure of which is incorporated herein by reference in its entirety.

BACKGROUND OF THE INVENTION

1. Field of the Invention

The present invention relates to an organic electroluminescent display device and, more particularly, to a method for arranging a power line at a position where a voltage drop in a cathode electrode and a voltage drop in the power line compensate each other.

2. Description of the Related Art

Generally, an organic electroluminescent display device is a self-emissive display device and may be classified as either a bottom surface emitting structure or a top surface emitting structure according to a direction in which light is emitted from an organic electroluminescent layer. The top surface emitting organic electroluminescent display device is a display device in which light is emitted in a direction opposite to a substrate on which pixels are arranged. With the top surface emitting organic electroluminescent display device, it is possible to increase an aperture ratio, which is an advantage over the bottom surface emitting structure in which light is emitted in a direction of the substrate on which the pixels are arranged.

In the top surface emitting structure, a transparent electrode should be employed as a cathode electrode since light is emitted toward an encapsulation substrate. A transparent conductive film, such as indium tin oxide (ITO) or indium zinc oxide (IZO), is generally employed as the transparent electrode. However, it is difficult to use such transparent electrode as the cathode electrode because of its high work function.

For this reason, as the cathode electrode, a transparent electrode having a laminated structure has been formed by depositing a thin metal with a low work function on an organic electroluminescent layer to form a transflective metal film (i.e. semi-transparent and semi-reflective metal film) and by depositing a thick transparent conductive film on the transflective metal film.

However, in the cathode electrode having the laminated structure, since the organic thin film layer is formed and then the ITO or IZO film (i.e., the transparent conductive film) is deposited thereon, a low temperature vapor deposition process is performed to minimize the deterioration of an electroluminescent (EL) layer due to heat or plasma. Depositing the ITO film or the IZO film at a low temperature causes the quality of the film to be degraded and the resistivity to be increased.

The cathode electrode is a common electrode, which should apply the same voltages to all pixels arranged in a pixel region. However, different levels of voltages are applied to the pixels according to positions of the pixels due to a voltage drop (i.e., IR drop) caused by the high resistivity of the cathode electrode. Consequently, if a cathode voltage from an external terminal is applied to the cathode electrode, a voltage difference is caused between a pixel arranged in a portion adjacent to the external terminal and a pixel arranged in a portion away from the external terminal. It results in non-uniformity of brightness or image quality due to the voltage difference between the pixels based on the positions of the pixels.

In particular, the voltage drop problem in middle and large sized top surface emitting organic electroluminescent display devices is even more serious. In order to solve this problem, a technique using a cathode bus line in a top surface emitting structure as disclosed in Korean Patent No. 2002-0057336 has been developed. Since the cathode bus line is coupled to an external terminal and is in contact with a cathode electrode, the cathode electrode is connected to the external terminal via the cathode bus line.

With such a contact, however, the smaller the portion where the cathode bus line connected to the external terminal and the cathode electrode deposited on an entire surface are contacted, i.e., the area of the cathode contact, the lower the current density, which leads to increase in generated heat.

Further, for a power line for applying a common power supply voltage VDD to the pixels, there is a problem in that a voltage difference is generated between pixels based on the positions of the pixels due to a voltage drop. Previously, a technique for preventing the voltage drop in the driving power line by connecting a bypass line extending in a direction perpendicular to the driving power line, to the driving power line to prevent the resistance increase was disclosed in Korean Laid-open Patent No. 2001-0014501. However, there is a problem with this method in that such a separate bypass line is required to be formed.

SUMMARY OF THE INVENTION

The present invention, therefore, solves aforementioned problems associated with conventional devices by providing an arrangement structure of a power line and a cathode contact for compensating/cancelling voltage drops of the power line and a cathode electrode in an organic electroluminescent display device.

In exemplary embodiments of the present invention, a voltage drop in a cathode electrode and a voltage drop in a power line are compensated by arranging the power line and the cathode electrode to be opposite to each other with a pixel array therebetween.

In an exemplary embodiment of the present invention, an organic electroluminescent display device includes: an insulating substrate having a pixel region in which a plurality of pixels are arranged; a power line for supplying a first voltage to the pixels; and an electrode having a contact for supplying a second voltage to the pixels, wherein an input side of the power line and the contact of the electrode are arranged on opposite sides of the pixel region.

In another exemplary embodiment according to the present invention, an organic electroluminescent display device includes: an insulating substrate having a pixel region in which a plurality of pixels are arranged; a power line for supplying a first voltage to the pixels; and an electrode having a contact for supplying a second voltage to the pixels, wherein an input side of the power line and the contact of the electrode are arranged on the substrate outside the pixel region such that a voltage drop in the power line and a voltage drop in the cathode electrode substantially cancel each other out.

In yet another exemplary embodiment according to the present invention, an organic electroluminescent display device includes: an insulating substrate having a pixel region in which a plurality of pixels are arranged, each of the pixels having at least a first electrode and a second electrode having a contact; and a power line for supplying a power supply voltage to the pixels, wherein an input side of the power line and the contact of the second electrode are arranged outside the pixel region such that voltage differences between the first electrodes and the second electrodes of the pixels connected to the power line become substantially uniform.

The electrode may be a cathode electrode, the contact may be a cathode contact, and the second voltage may be a cathode voltage. The device may further include a cathode bus line for applying an external cathode voltage, the second electrode being in contact with the cathode bus line via the contact to provide the external cathode voltage.

The contact may be arranged at a portion outside the pixel region on the insulating substrate where the input side of the power line is not arranged. The contact may be arranged opposite the input side of the power line with respect to the pixel region. The contact may be formed along a side of the pixel region opposite the input side to make an elongated contact with the cathode bus line.

In still another exemplary embodiment according to the present invention, an organic electroluminescent display device includes: an insulating substrate having a pixel region in which a plurality of pixels are arranged; a power line having multiple input sides for supplying power supply voltages to the pixels; a cathode electrode having a cathode contact for supplying a cathode voltage to the pixels, wherein the cathode contact of the cathode electrode is arranged on the substrate outside the pixel region at a portion where the multiple input sides of the power line are not arranged.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
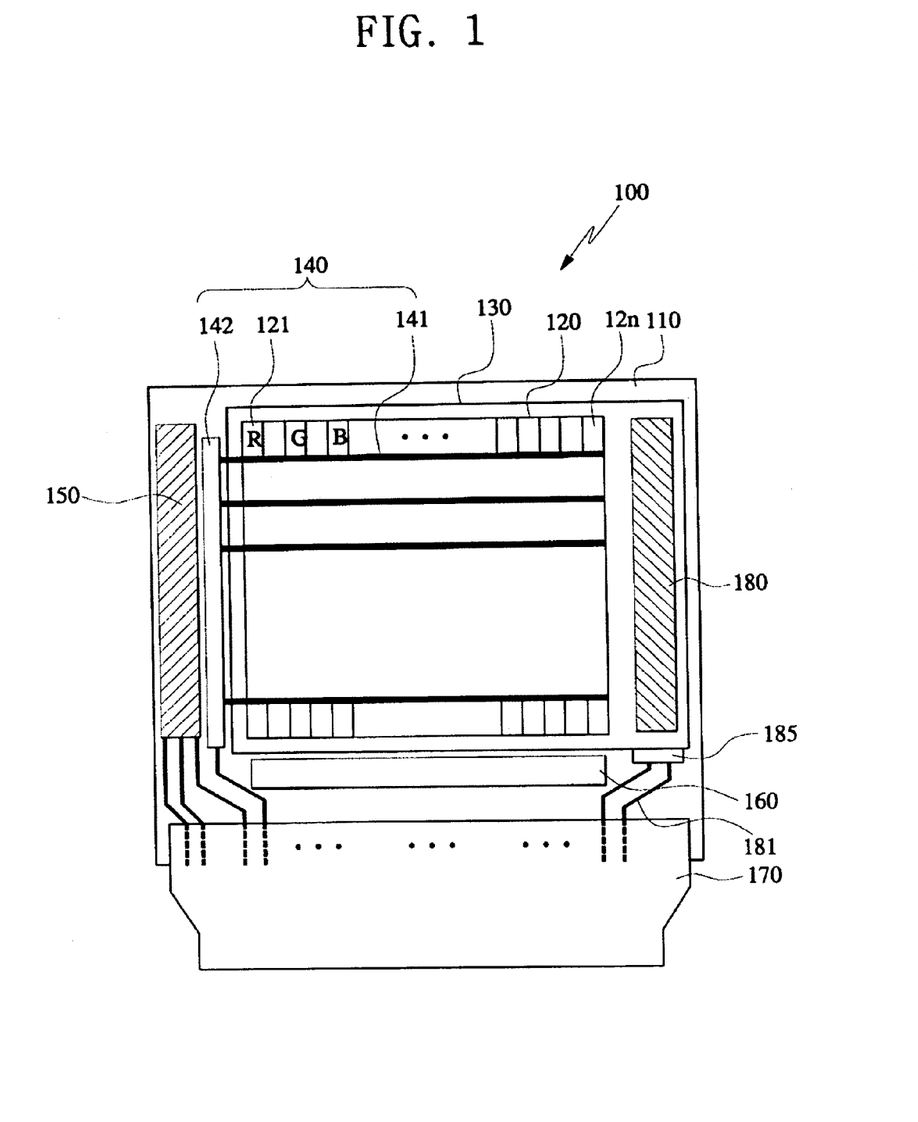
FIG. 1 is a schematic plan view illustrating a layout for a power line and a cathode contact in an organic electroluminescent display device according to a first exemplary embodiment of the present invention.

Referring to FIG. 1, an organic electroluminescent display device 100 includes an insulating substrate 110 having a pixel region 120 in which a plurality of pixels are arranged. A scan driver 150 for sequentially providing scan signals to the pixels in the pixel region 120, and a data driver 160 for providing data signals to the pixels in the pixel region 120 are arranged on the insulating substrate 110 outside the pixel region 120.

In the first exemplary embodiment of the present invention, for example, the scan driver 150 is arranged on the insulating substrate 110 at the left of the pixel region 120 and the data driver 160 is arranged on the insulating substrate 110 below the pixel region 120. However, the present invention is not necessarily limited to such an arrangement. In other embodiments, the scan driver 150 and the data driver 160 may change their positions with each other. Further, the scan driver 150 and the data driver 160 may be arranged in any suitable portion outside the pixel region 120 on the insulating substrate 110.

Figure 3:
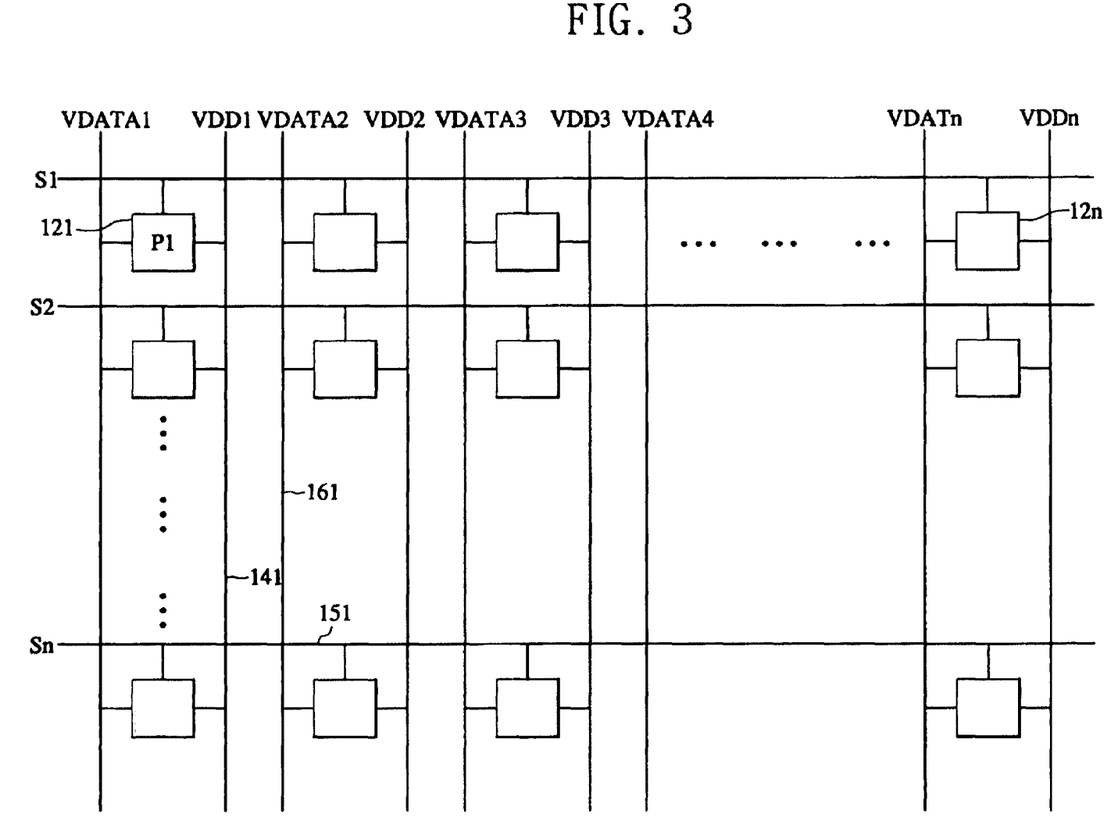
FIG. 3 is a plan view illustrating a pixel arrangement in a pixel region in an organic electroluminescent display device in exemplary embodiments of the present invention.

A plurality of pixels 121 to 12n are arranged in a matrix form of rows and columns in the pixel region 120. Referring now to FIG. 3, which is a plan view of the pixels arranged in the pixel region 120, a plurality of gate lines 151 to which scan signals S1 to Sn from the scan driver 150 are sequentially applied and a plurality of data lines 161 to which data signals VDATA1 to VDATAn from the data driver 160 are applied are arranged to intersect each other. A plurality of power lines VDD1-VDDn 141 for providing power supply voltages VDD to the pixels (e.g., P1) which are connected to the data lines 161 and the gate lines 151 and corresponding to 121 to 12n in FIG. 1, are arranged to intersect with the gate lines 151 and in parallel with the data lines 161.

A cathode electrode 130 is formed as an entire surface electrode over the pixel region 120 in which R, G and B pixels 121-12n are arranged. While not shown in FIG. 1, each of the R, G and B unit pixels has a typical structure in which a pixel electrode connected to a thin film transistor, an organic electroluminescent layer and the cathode electrode 130 are laminated. By way of example, in FIG. 3, a pixel includes a thin film transistor coupled between VDD2 and an anode electrode of a schematic representation of an organic electroluminescent device. The cathode electrode of the organic electroluminescent device is the cathode electrode 130. Of course, each of the pixels illustrated in FIG. 3 would have a similar structure. Further, each pixel also includes additional components such as additional thin film transistors, as those skilled in the art would appreciate. A cathode voltage is applied to all of the unit pixels 121-12n arranged in the pixel region 120, using the cathode electrode 130 as the entire surface electrode.

The cathode electrode 130 includes a cathode contact 180 in contact with a metal film, for example, and a cathode bus line 185 connected to external terminals 181 to which an external cathode voltage is applied. While not shown in detail in FIG. 1, the cathode bus line 185 is arranged in a variety of forms, such as a line, a grid, or the like, in the pixel region 120 and is connected to the cathode electrode 130 via the cathode contact 180. Thus, the cathode bus line 185 is configured to provide the cathode voltage applied from the external terminals 181 to the pixels 121 to 12n.

Further, a power line 140 is arranged to provide a power supply voltage VDD to the pixels 121 to 12n. The power line 140 includes a plurality of branch lines 141 arranged in the pixel region 120 for supplying the power supply voltage VDD to the pixels 121 to 12n, and an input line 142 connected to the branch lines 141 in common for inputting the external power supply voltage VDD to the branch lines 141. The multiple branch lines 141 of the power line 140 are arranged corresponding to the pixel region 120, and the input line 142 is arranged in a left portion just outside the pixel region 120. In other words, the input line 142 is disposed on the insulating substrate 110 between the pixel region 120 and the scan driver 150.

In FIG. 1, a flexible printed circuit (FPC) 170 connects the scan driver 150 and the data driver 160, for example, to an external controller (not shown) to provide signals from the controller to the drivers, and connects the power line 140 and the cathode electrode 130 to the controller to provide predetermined voltages from the controller to the power line 140 and the cathode electrode 130.

In the first exemplary embodiment of the present invention, the cathode contact 180 for connecting the cathode electrode 130 to the cathode bus line 185 is arranged opposite the input line 142 of the power line 140 with respect to the pixel region 120 so that the voltage drop in the cathode electrode 130 and the voltage drop in the power line 140 compensate each other.

In other words, the cathode contact 180 is arranged on the insulating substrate 110 outside the pixel region 120 in an area where the input line 142 of the power line 140 is not arranged. The cathode contact 180 should be arranged at a position opposite to an input side of the power line 140 for inputting the power supply voltage to the pixels in the pixel region 120, namely, the input line 142 for providing the power supply voltage to the branch lines 141 of the power line 140.

Thus, it is possible to form the cathode contact 180 in an elongated form similar to the common line 142 by positioning the cathode contact 180 on the insulating substrate 110 opposite to the input side of the power line for providing the power supply voltage from the power line 140 to the pixels. As a result, the increased area of the cathode contact 180 causes a contact area between the cathode bus line 185 and the cathode electrode 130 to increase, thereby reducing contact resistance, lowering current density and reducing the amount of generated heat.

In the first exemplary embodiment of the present invention, the cathode contact 180 and the input side of the power line 140 are arranged to be opposite to each other so that the voltage drop in the power line 140 and the voltage drop in the cathode electrode, namely, a cathode line, compensate each other.

In other words, the same power supply voltages should be applied to the pixel 121 adjacent to the input line 142 of the power line 140, i.e., to a portion where the power supply voltage is inputted to the pixels in the pixel region 120, as the pixel 12n located away from the input line 142 of the power line 140 among the pixels connected to the same line. However, the power supply voltage VDD1 of the pixel 121 and the power supply voltage VDDn of the pixel 12n are applied at different levels due to the voltage drop by a resistance component of the power line. In other words, the power supply voltage VDDn of the pixel 12n has a level lower than that of the power supply voltage VDD1 of the pixel 121.

Further, regarding the voltage drop in the cathode electrode 130, the same cathode voltages should be applied to the pixel 121 arranged away from the cathode contact 180 and the pixel 12n arranged adjacent to the cathode contact 180 among the pixels connected to the same line, but different levels of cathode voltages are applied to the pixels due to the voltage drop caused by the resistance component of the cathode electrode 130. In other words, the cathode voltage applied to the pixel 121, which is located away from the cathode contact 180, is lower in level than the cathode voltage applied to the pixel 12n, which is located adjacent to the cathode contact 180.

Suppose the cathode contact 180 and the input side of the power line 140 were both arranged on the same side, for example, at the left of the pixel region 120, the power supply voltage VDD relatively lower than that for the pixel 121 would be applied to the pixel 12n due to the voltage drop in the power line, and the cathode voltage relatively lower than that for the pixel 121 due to the voltage drop in the cathode electrode would also be applied to the pixel 12n.

Accordingly, the pixel 12n would be influenced stronger by the voltage drop as compared with the pixel 121 due to the voltage drops in both the power line and the cathode line. Thus, since there would be a significant gap between a voltage difference between the anode electrode and the cathode electrode of the pixel 121 and a voltage difference between the anode electrode and the cathode electrode of the pixel 12n, the brightness non-uniformity problem would be more pronounced.

However, as in the first exemplary embodiment of the present invention, when the cathode contact 180 and the input side of the power line 140 are arranged opposite each other, the voltage drop in the power line 140 has a larger influence on the pixel 12n than on the pixel 121, and the voltage drop in the cathode electrode 130 has a larger influence on the pixel 121 than on the pixel 12n. The influences of the voltage drops cancel each other out by maintaining the voltage differences between the anode electrodes and the cathode electrodes of all the pixels arranged in the pixel region 120 substantially uniform at every position. Thus, it is possible to reduce the brightness non-uniformity.

Figure 2:
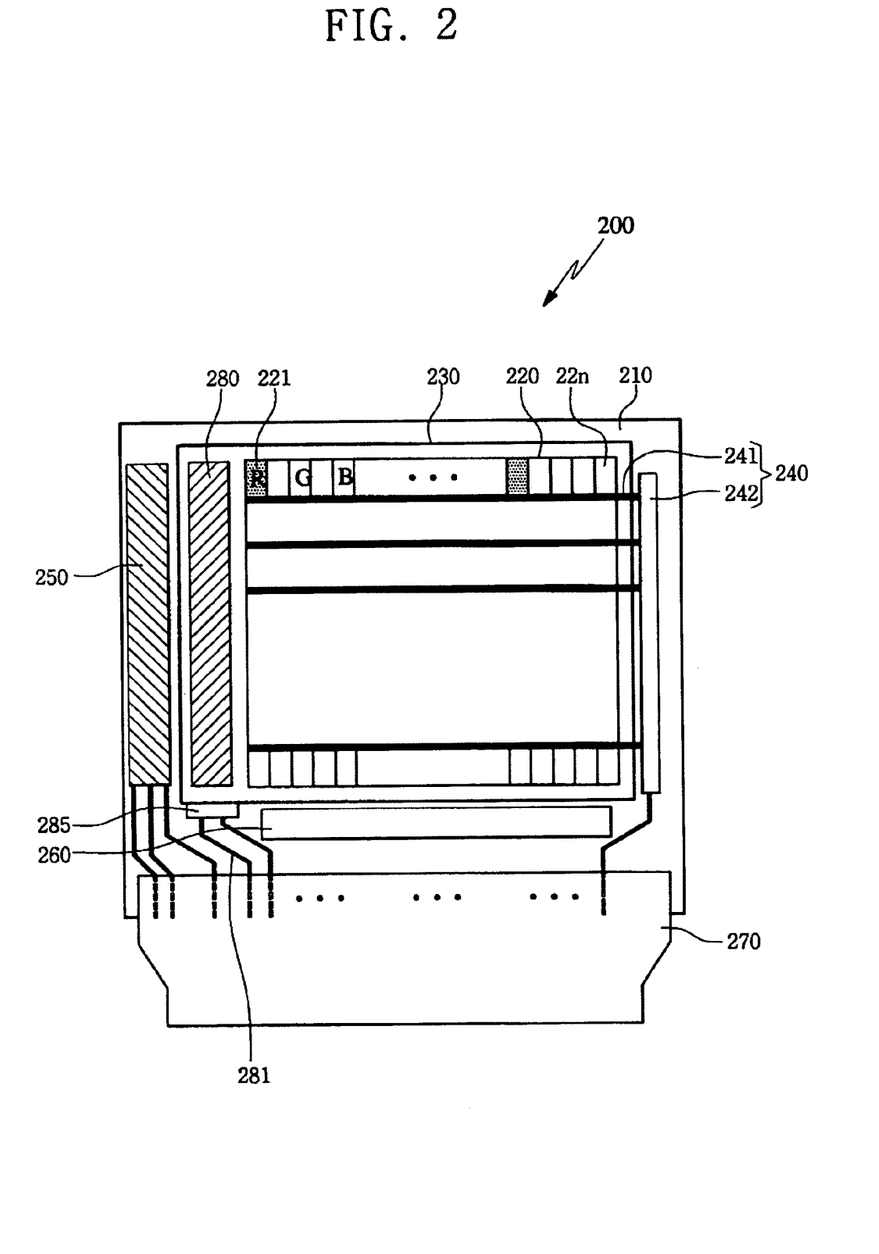
FIG. 2 is a schematic plan view illustrating a layout for a power line and a cathode contact in an organic electroluminescent display device according to a second exemplary embodiment of the present invention.

Referring to FIG. 2, an organic electroluminescent display device 200 according to the second exemplary embodiment of the present invention is different from the first exemplary embodiment in that the positions for a cathode contact 280 and an input line 242 of a power line 240 are interchanged. In other words, the cathode contact 280 is arranged on the left side of a pixel region 220 on an insulating substrate 210, and the input line 242 is arranged on the right side of the pixel region 220. By interchanging the positions of the cathode contact 280 and the input line 242, the organic electroluminescent display device 200 has the same voltage drop compensation effect as the organic electroluminescent display device 100 of FIG. 1. The power line 240 also includes multiple branch lines 241 for providing the power supply voltage VDD to the pixels.

Pixels 221-22n arranged in the pixel region 220 of the organic electroluminescent display device 200 are arranged similarly as the pixels 121-12n of the organic electroluminescent display device 100. Further, the organic electroluminescent display device 200 has a scan driver 250 and a data driver 260 for providing scan signals and data signals, respectively, to the pixels 221-22n.

In the organic electroluminescent display device 200 of FIG. 2, a cathode electrode 230 is formed as a common electrode as an entire surface electrode over the pixel region 220, and is connected to a cathode bus line 285 via the cathode contact 280. The cathode bus line is used to receive an external cathode voltage from an external controller (not shown) through an FPC 270 and external terminals 281. The external controller also provides corresponding voltages to the scan driver 250, the data driver 260, and the power line 240 through the FPC 270.

In the first and second exemplary embodiments of the present invention described above, a power line having one input line was used in an organic electroluminescent display device. In the third exemplary embodiment, a power line having multiple input lines is used in an organic electroluminescent display device.

Figure 4:
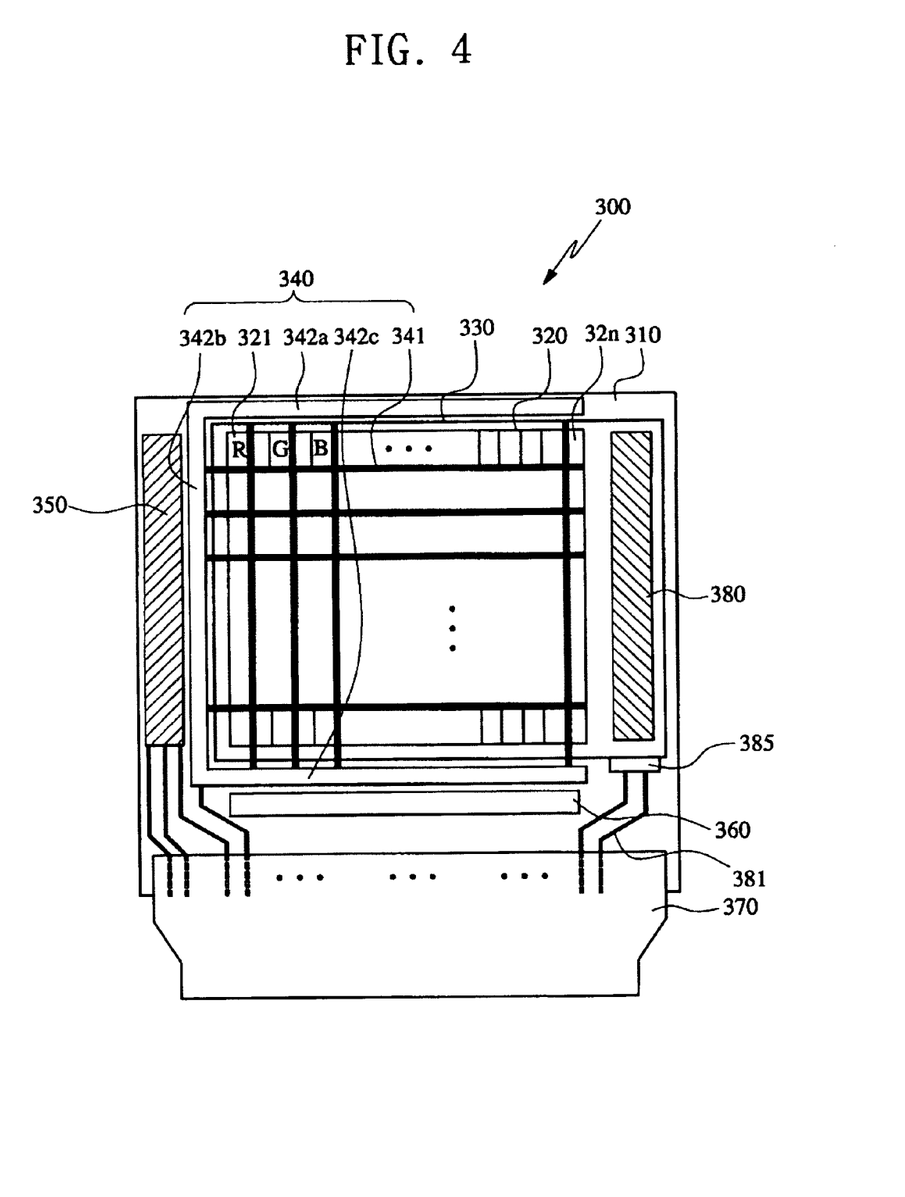
FIG. 4 is a schematic plan view illustrating a layout for a power line and a cathode contact in an organic electroluminescent display device according to a third exemplary embodiment of the present invention.

Referring to FIG. 4, an organic electroluminescent display device 300 according to the third exemplary embodiment includes a scan driver 350, a data driver 360, and a power line 340 having multiple input lines, for example, three input lines 342a, 342b and 342c. In the power line 340, the multiple input lines 342a, 342b and 342c are arranged around an outer periphery of a pixel region 320 formed on an insulated substrate 310, and provide power supply voltages to a plurality of pixels 321 to 32n in the pixel region 320 via branch lines 341.

Further, a cathode electrode 330 formed over the pixel region 320 is coupled to a cathode bus line 385 via a cathode contact 380, and the cathode contact 380 is arranged to be positioned along the side of the outer periphery where the multiple input lines 342a, 342b and 342c of the power line 340 are not arranged. In other words, the cathode contact 380 is arranged in an area at a right side of the pixel region 320 where the multiple input lines 342a, 342b and 342c of the power line 340 are not arranged. The cathode contact 380 is coupled to an FPC 370 through external terminals 381.

Figure 5:
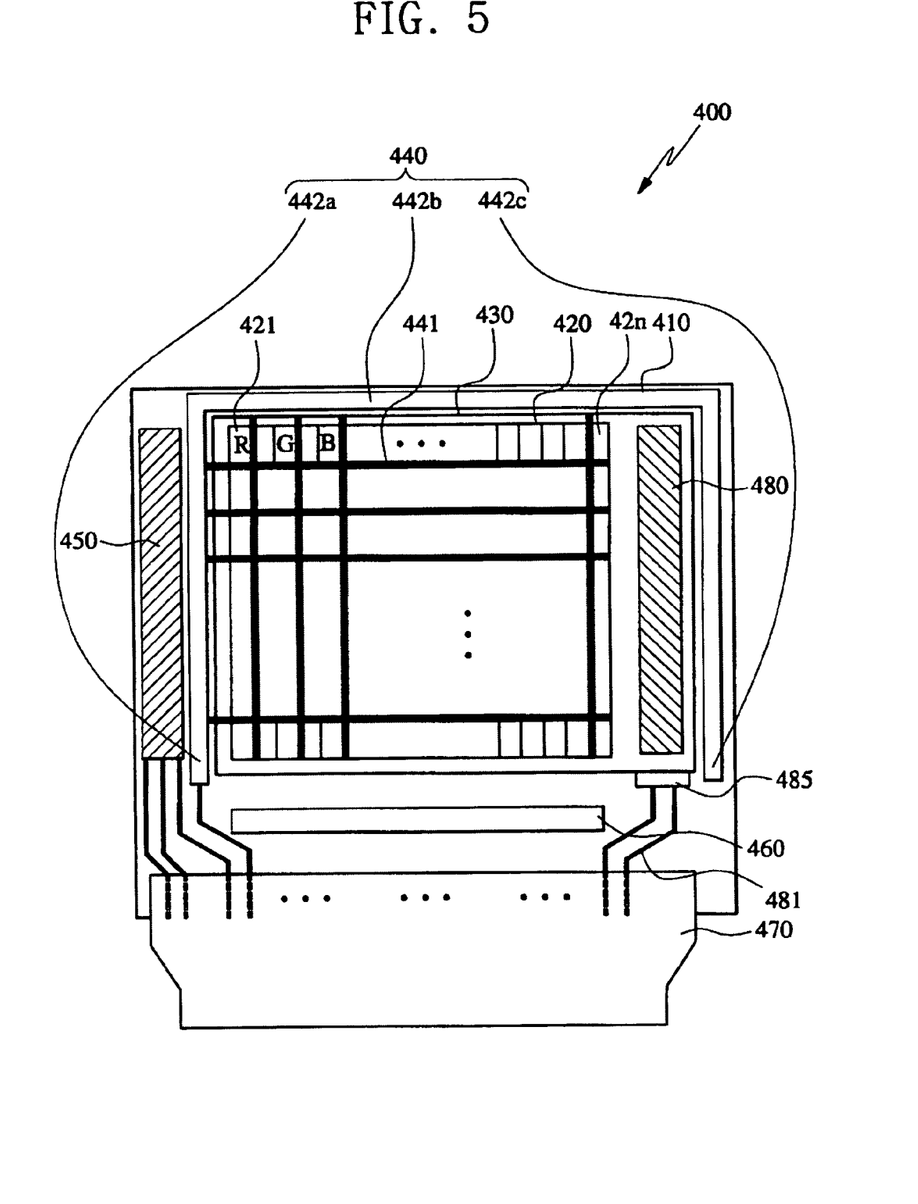
FIG. 5 is a schematic plan view illustrating a layout for a power line and a cathode contact in an organic electroluminescent display device according to a fourth exemplary embodiment of the present invention.

Referring to FIG. 5, an organic electroluminescent display device 400 according to the fourth exemplary embodiment of the present invention includes a scan driver 450, a data driver 460, and a power line 440 having multiple input lines 442a, 442b and 442c similar to the organic electroluminescent display device according to the third exemplary embodiment. However, in the third exemplary embodiment, the power supply voltages are simultaneously provided from the multiple input lines 342a, 342b and 342c of the power line 340 to a plurality of pixels 321 to 32n in the pixel region 320 via branch lines 341, while in the fourth exemplary embodiment, the power supply voltages are provided from one input line 442a to a plurality of pixels 421 to 42n in a pixel region 420 formed on an insulated substrate 410 via branch lines 441. Furthermore, a cathode contact 480 is arranged along the right side of an outer periphery of the pixel region 420, where the input line 442a is not arranged.

The cathode contact 480 makes a contact with a cathode electrode 430 formed over the pixel region 420 as a common electrode, and supplies a cathode voltage thereto. The cathode contact receives the cathode voltage from an external controller over a cathode bus line 485, which receives the cathode voltage through an FPC 470 and external terminals 481.

In the organic electroluminescent display device according to the third and fourth exemplary embodiments, the cathode contact is arranged on the substrate on one side of the outer periphery of the pixel region where the input sides of the power line are not arranged as in the organic electroluminescent display devices according to the first and second exemplary embodiments, thus obtaining the above-stated voltage drop compensation/cancelling effect. Further, the pixels arranged in the pixel region of the organic electroluminescent display device according to the third and fourth exemplary embodiments are arranged as in the first exemplary embodiment.

Although in the organic electroluminescent display device according to the third and fourth exemplary embodiments of the present invention, a power line having three input lines has been described, the present invention is applicable to a variety of structures in which the power line has multiple input sides, wherein the cathode contact is arranged on the substrate outside the pixel region at a portion where there are no input sides of the power line. Thus, the cathode contact is arranged outside the pixel region at a portion where the input sides of the power line are not arranged, thereby obtaining the voltage drop compensation/cancelling effect. Further, although the structure in which the branch lines of the power line are arranged in a mesh form or stripe form in a pixel region has been illustrated, the structure of the branch lines is not necessarily limited to it but all structures in which a power supply voltage can be supplied from the input sides to the pixels are possible.

According to the exemplary embodiments of the present invention as described above, voltage drops caused by resistance components of the power line and the cathode electrode cancel each other out when the input side of the power line and the cathode contact are arranged to be opposite each other, thus improving brightness uniformity. Further, the contact resistance and the amount of generated heat can be reduced by increasing a contact area between the cathode electrode and the cathode bus line.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic electroluminescent display device, comprising:
    an insulating substrate;
    a display region comprising a plurality of pixels on the insulating substrate;
    a plurality of gate lines and a plurality of data lines, each of the gate lines or each of the data lines extending between a first side and a second side of the display region;
    a power line extending across the display region and configured to supply a first voltage to all the pixels, wherein a voltage drop appears along the power line; and
    an electrode extending across the display region and having a contact configured to supply a second voltage to all the pixels, wherein a voltage drop appears along the electrode such that the voltage drop in the power line cancels out the voltage drop in the electrode, thereby applying a substantially uniform voltage difference between the power line and the electrode to each of the pixels,
    wherein an input side of the power line is only at the first side of the display region and the contact of the electrode is only at the second side of the display region opposite to the first side, the input side of the power line and the contact of the electrode being at a periphery of the display region such that all the pixels are located between the input side of the power line and the contact of the electrode.

2. The device according to claim 1, wherein the electrode is a cathode electrode, the contact is a cathode contact, and the second voltage is a cathode voltage.

3. The device according to claim 1, wherein the electrode is a cathode electrode, and the device further includes a cathode bus line for applying an external cathode voltage, the electrode being in contact with the cathode bus line via the contact to provide the external cathode voltage to the pixels.

4. The device according to claim 3, wherein the contact is formed along a corresponding one of said opposite sides to make an elongated contact with the cathode bus line.

5. An organic electroluminescent display device, comprising:
    an insulating substrate;
    a display region comprising a plurality of pixels on the insulating substrate;
    a plurality of gate lines and a plurality of data lines, each of the gate lines or each of the data lines extending between a first side and a second side of the display region;
    a power line configured to supply a first voltage to all the pixels; and
    an electrode having a contact configured to supply a second voltage to all the pixels,
    wherein an input side of the power line and the contact of the electrode are arranged on the substrate at a periphery of the display region and outside the display region only at the first side and only at the second side of the display region, respectively, such that a voltage drop in the power line and a voltage drop in the electrode substantially cancel each other out, thereby applying a substantially uniform voltage difference between the power line and the electrode to each of the pixels.

6. The device according to claim 5, wherein the electrode is a cathode electrode, the contact is a cathode contact, and the second voltage is a cathode voltage.

7. The device according to claim 5, wherein the electrode is a cathode electrode, and the device further includes a cathode bus line for applying an external cathode voltage, the electrode being in contact with the cathode bus line via the contact to provide the external cathode voltage to the pixels.

8. The device according to claim 7, wherein the contact is formed along a side of the display region opposite the input side to make an elongated contact with the cathode bus line.

9. The device according to claim 5, wherein the contact is arranged at a portion outside the display region on the insulating substrate where the input side of the power line is not arranged.

10. The device according to claim 5, wherein the contact is arranged outside the display region opposite the input side of the power line with respect to the display region.

11. An organic electroluminescent display device, comprising:
an insulating substrate;
a display region comprising a plurality of pixels on the insulating substrate, such that all the pixels are located in the display region, each of the pixels having at least a first electrode and a second electrode having a contact;
a plurality of gate lines and a plurality of data lines, each of the gate lines or each of the data lines extending between a first side and a second side of the display region; and
a power line configured to supply a power supply voltage to all the pixels, wherein an input side of the power line and the contact of the second electrode are arranged at a periphery of the display region and outside the display region only at the first side and only at the second side of the display region, respectively, such that voltage differences between the first electrodes and the second electrodes of the pixels connected to the power line are substantially uniform.

12. The device according to claim 11, wherein the second electrode is a cathode electrode, the contact is a cathode contact, and a voltage of the second electrode is a cathode voltage.

13. The device according to claim 11, wherein the electrode is a cathode electrode, and the device further includes a cathode bus line for applying an external cathode voltage, the second electrode being in contact with the cathode bus line via the contact to provide the external cathode voltage.

14. The device according to claim 13, wherein the contact is formed along a side of the display region opposite the input side to make an elongated contact with the cathode bus line.

15. The device according to claim 11, wherein the contact is arranged at a portion outside the display region on the insulating substrate where the input side of the power line is not arranged.

16. The device according to claim 11, wherein the contact is arranged opposite the input side of the power line with respect to the display region.

17. An organic electroluminescent display device, comprising:
an insulating substrate;
a display region comprising a plurality of pixels on the insulating substrate, such that all the pixels are located in the display region, each of the pixels having at least a first electrode and a second electrode;
a plurality of gate lines and a plurality of data lines, each of the gate lines or each of the data lines extending between a first side and a second side of the display region;
a power line having multiple input sides configured to supply power supply voltages to the first electrodes of all the pixels only at the first side of the display region; and
a cathode electrode having a cathode contact configured to supply a cathode voltage to the second electrodes of all the pixels only at the second side of the display region, such that voltage differences between the first electrodes and the second electrodes of the pixels are substantially uniform,
wherein the cathode contact of the cathode electrode is arranged on the substrate at a periphery of the display region and outside the display region at a portion where the multiple input sides of the power line are not arranged.

18. The device according to claim 17, wherein the cathode electrode further includes a cathode bus line for applying an external cathode voltage, the cathode electrode being in contact with the cathode bus line via the cathode contact to provide the external cathode voltage to the pixels.

19. The device according to claim 18, wherein the contact is formed along a side of the display region at the portion where the multiple input sides are not arranged to make an elongated contact with the cathode bus line.

* * * * *